United States Patent [19]

Genrich

[11] Patent Number: 4,553,218
[45] Date of Patent: Nov. 12, 1985

[54] SYNCHRONOUS CARRY FREQUENCY DIVIDER AND METHOD OF USING THEREFOR

[75] Inventor: Thad J. Genrich, Mesa, Ariz.

[73] Assignee: Motorola, Inc., Schaumburg, Ill.

[21] Appl. No.: 470,687

[22] Filed: Feb. 28, 1983

[51] Int. Cl.[4] .................... G06F 7/68; H03K 21/16; H03K 21/32

[52] U.S. Cl. ...................................... 364/703; 377/52; 377/107

[58] Field of Search .................... 364/703; 377/47, 52, 377/107, 110, 127

[56] References Cited

U.S. PATENT DOCUMENTS

| | | | |
|---|---|---|---|
| 3,538,442 | 11/1970 | Arkell et al. | 377/42 |
| 3,564,220 | 2/1971 | Peddie et al. | 377/47 |
| 3,649,815 | 3/1972 | Clifford | 377/45 |
| 3,849,635 | 11/1974 | Freedman | 377/44 |
| 3,962,565 | 6/1976 | Guyen-Phuoc | 377/55 |
| 4,002,926 | 1/1977 | Moyer | 377/107 |
| 4,160,898 | 7/1979 | Gaon | 377/30 |
| 4,231,099 | 10/1980 | Stauers | 364/718 |
| 4,390,960 | 6/1983 | Yamashita et al. | 364/703 |
| 4,413,350 | 11/1983 | Bond et al. | 377/47 |

OTHER PUBLICATIONS

Lenk, *Logic Designer's Manual*, Reston Publishing Company, 1977, chapter 4, pp. 222-226.

*Primary Examiner*—David H. Malzahn
*Attorney, Agent, or Firm*—Eugene A. Parsons

[57] ABSTRACT

A synchronous carry frequency divider having a series of counters wherein each pair of counters is separated by a flip-flop and wherein the last counter in the series is followed by a terminal flip-flop. The counters and the flip-flops are synchronously clocked so that the divisor ratio is increased by the number of flip-flops employed. When the terminal flip-flop is toggled by the last counter a terminal count signal and a preset enable signal are simultaneously achieved without the delays associated with terminal count decode networks.

16 Claims, 2 Drawing Figures

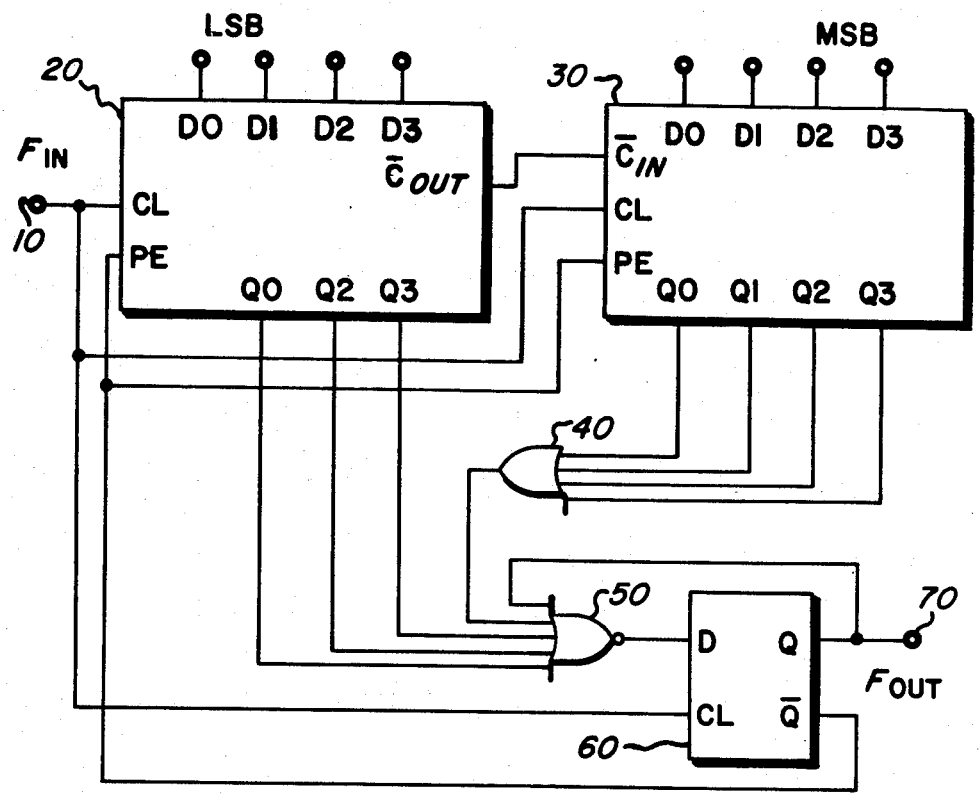
FIG. 1 —PRIOR ART—
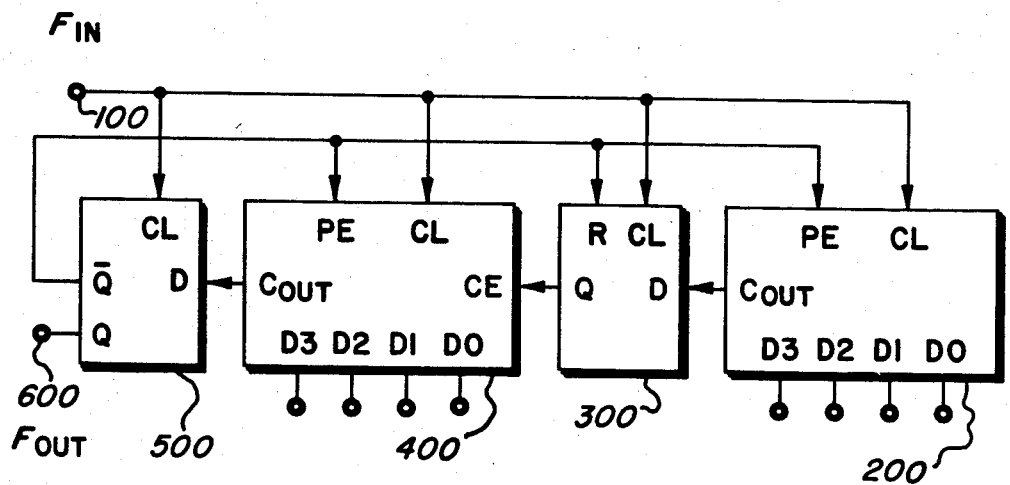
FIG. 2

SYNCHRONOUS CARRY FREQUENCY DIVIDER AND METHOD OF USING THEREFOR

BACKGROUND OF THE INVENTION

The present invention pertains to frequency dividers and methods therefor and in particular to synchronous carry frequency dividers using a series of counters and methods therefor.

Phase-locked loop and frequency synthesis applications often require the use of frequency dividers having a high frequency capability. Digital frequency dividers are commonly implemented by a programmable counter having a gating structure which provides an output pulse after a programmed number of input pulses have been received. This output pulse is used both to provide an indication that the desired count has been reached and to enable reloading of the counter.

Digital frequency dividers often use a pulsed input signal to clock a counter the terminal count of which provides an output signal at a frequency equal to an integral submultiple, hereinafter referred to as the divide modulus, of the frequency of the pulsed input signal. Especially where the divide modulus is very large, it is impractical to implement a frequency divider using a single, commercially available counter.

One approach used in existing counters for providing a larger divide modulus involves linking several counters in series, carry output to carry input. When linked in this way the carry input line overrides the clock in order to allow several devices to be cascaded into a fully synchronous multi-stage counter. However, in this approach the carry signal associated with the last count must ripple through all of the counters from that containing the least significant bit to the counter containing the most significant bit within one clock period to provide the desired terminal count and to preset the counters for the next counting cycle. The propagation delay associated with the ripple carry technique severely restricts the maximum operating frequency of counters having a large divide modulus.

One approach to overcoming the delays associated with the ripple carry technique involves the use of an external decoding network. In this approach, a gate is used with each counter to decode the terminal count condition one clock pulse before the zero state of the counter so that the clock pulse necessary for presetting is included in the programmed input number. Thus, in order to detect the terminal count the decode network approach requires a reasonably complex terminal count decode network. In addition to externally decoding the preset condition, a pulse "gobbling" technique may be used wherein the terminal count is detected two clock pulses before the zero state of the counter but wherein an external flip-flop in series with the decoding gate holds a pulse until one clock pulse before the zero state of the counter. In this way an even shorter preset delay time is achieved because the decoded delay and the set up time for presetting the counter do not have to occur within one clock period but rather occur within separate clock periods. Nevertheless, for large modulus dividers a reasonably complex terminal count decode network is required which increases the cost and complexity of the divider. Furthermore, the external decoding approach introduces a delay of its own which may need to be compensated for by pulse gobbling or some other technique in order to achieve high frequency counters.

It is therefore desirable to provide a frequency divider which does not require the cost and complexity of external decoding and yet which does not possess the delay of ripple carry dividers.

SUMMARY OF THE INVENTION

Accordingly it is an object of the present invention to provide a new and improved synchronous carry frequency divider.

It is a further object of the present invention to provide a new and improved counting apparatus for using in a frequency divider.

It is a further object to provide a new and improved method for using a series of counters to provide a frequency divider having a high modulus.

Among the advantages of the present invention are reduced complexity, reduced part count and reduced cost as compared to existing frequency dividers. Another advantage of the present invention is the ability to attain faster operating speeds as compared to existing devices.

These and other objects of the present invention will become apparent to those skilled in the art upon consideration of the accompanying specification, claims and drawings.

In order to attain the above-mentioned and other objects and advantages, the present invention involves a frequency divider comprising a series of counters, at least all but the initial counter in the series having a count enable input, each counter in the series having a terminal count output for providing a terminal count signal and each counter in the series being coupled to means for applying a clock signal. Means are coupled between the terminal count output of a first counter and the count enable input of a second counter in each successive pair of counters for synchronizing application of a terminal count signal to a count enable input. The means for synchronizing are coupled to the means for applying a clock signal.

A counting apparatus according to the present invention comprising a series of counting units wherein each unit comprises a counter having a terminal count output for providing a terminal count signal and means, coupled to the terminal count output, for synchronizing the terminal count signal with a clock signal applied by means for providing a clock signal.

The method according to the present invention involves using a series of counters to provide a frequency divider having a high modulus. The method comprises the steps of providing a clock signal, synchronizing the terminal count of each counter with the clock signal and enabling the clocking of a second counter in each successive pair of counters with the synchronized terminal count of the first counter in the pair.

BRIEF DESCRIPTION OF THE DRAWINGS

FIG. 1 shows a synchronous carry frequency divider according to the prior art; and FIG. 2 illustrates a synchronous carry frequency divider according to the present invention.

DESCRIPTION OF THE PREFERRED EMBODIMENT

In a prior art frequency divider as illustrated in FIG. 1, a terminal 10 suitable for application of a clock frequency $F_{in}$, is connected to a clock input CL of a first four bit counter 20. Counter 20 has inputs D0, D1, D2 and D3 suitable for presetting counter 20, and also has a preset enable input PE which must be in the low state for information present on inputs D0, D1, D2 and D3 to be entered into counter 20. Counter 20 also has three outputs Q0, Q2 and Q3 suitable for application of the output of a first, a third and a fourth stage of counter 20.

A second four bit counter 30 has a clock input CL connected to terminal 10, has four preset inputs, D0, D1, D2 and D3 and has a preset enable input PE which must be at a low level in order for information present on inputs D0, D1, D2 and D3 to be entered into counter 30. Counter 30 also has four outputs Q0, Q1, Q2 and Q3 each of which corresponds to a stage of four bit counter 30. In addition, counter 30 has a count enable or carry input $\overline{C}_{IN}$ which is connected to a terminal count or carry output $\overline{C}_{OUT}$ of counter 20.

An OR gate 40 has four inputs each of which is connected to one of outputs Q0, Q1, Q2 or Q3 of counter 30 and has an output connected to a first input of a NOR gate 50. NOR gate 50 has a second, a third and a fourth input respectively connected to outputs Q0, Q2 and Q3 of counter 20.

A type D flip-flop 60 has a D input connected to an output of NOR gate 50, has a Q output connected both to a fifth input of NOR gate 50 and to a terminal 70 suitable for provision of a frequency divider output. Flip-flop 60 also has a clock input CL connected to terminal 10 and has a $\overline{Q}$ output connected to the preset enable inputs of counters 20 and 30.

In the prior art device of FIG. 1, gates 40 and 50 are used to externally decode the preset condition for the counter. In the example of FIG. 1, counters 30 and 20 are linked to count down from a most significant bit MSB preset in counter 30 to a least significant bit LSB preset in counter 20. On reaching the count of 2, all of the outputs of counter 30 are low so that the output of OR gate 40 is low and outputs Q0, Q2 and Q3 of counter 20 are low so that all of the inputs to NOR gate 50 are low and the output of NOR gate 50 is high. Thus, the D input of flip-flop 60 is forced high so that on the next clock pulse, the high state is clocked into the flip-flop at that time, the Q output of flip-flop 60 goes high, causing the fifth input of NOR gate 50 to go high and hence its output to go low, and the $\overline{Q}$ output of flip-flop 60 goes low so that the PE inputs of counters 20 and 30 go low. Because the PE inputs of counters 20 and 30 are low, the succeeding clock pulse presets counters 20 and 30. The succeeding clock pulse also causes the low state of the output of NOR gate 50 to be loaded into flip-flop 60 so that the levels of the Q and $\overline{Q}$ outputs of flip-flops 50 are reversed and, as a consequence, the PE inputs of counters 20 and 30 return to a high state. Counters 20 and 30 are then ready to proceed in the decrement count mode.

The advantage of the structure of FIG. 1 is that the decode delay and set-up time for presetting counters 20 and 30 do not have to occur within one clock period. These two times occur within separate clock periods allowing a higher frequency of operation.

In the preferred embodiment of the present invention as illustrated in FIG. 2, a first counter 200 has a clock input CL and a preset enable input PE. Counter 200 also has presetting inputs D0, D1, D2 and D3. Counter 200 is constructed so that when input PE is in a low state, information present on the presetting inputs is entered into counter 200 on a positive transition of a clock pulse applied to input CL which is connected to a terminal 100 suitable for application of a clocking frequency $F_{IN}$.

A first type D flip-flop 300 has a D input connected to a terminal count or carry output $C_{OUT}$ of counter 200, has a clock input CL connected to terminal 100 and has a reset input R.

A second counter 400 has a preset enable input PE, has a clock input CL and has a count enable input CE which is connected to a Q output of flip-flop 300. In addition, counter 400 has presetting inputs D0, D1, D2 and D3 which are preset in the same manner as described for counter 200.

A second D-type flip-flop 500 has a clock input CL connected to terminal 100 and has a D input connected to a terminal count or carry output COUT of counter 400. Flip-flop 500 further has a Q output connected to a terminal 600 suitable for application of an output frequency $F_{OUT}$ and has a $\overline{Q}$ output connected to preset enable inputs of counters 200 and 400.

Presettable counters and flip-flops are well known and readily available to those skilled in the art. Devices which may be employed according to the present invention include a counter with a part number of 74F-161 and a flip-flop with a part number of 74F-109, both available from Fairchild Semiconductor Division of Fairchild Camera and Instrument Corp., Mountain View, California.

In the operation of the preferred embodiment, all flip-flops and counters are clocked from a single input source. The terminal count of each counter is fed into the input of a flip-flop. An output of each flip-flop drives the count enable input of a succeeding counter. In this configuration, a terminal count indication from a counter is synchronously delayed one clock cycle from the time it is detected until it is input into the next higher order counter. In this manner, the terminal count need not ripple through all the devices in one clock cycle to obtain a preset enable pulse. The output of the final flip-flop provides a pulse used to enable the presetting of the counters and to reset other flip-flops. As is obvious to one skilled in the art, the divisor ratio of the preferred embodiment is increased by the number of flip-flops in the design. In a microprocessor controlled environment, this presents no particular difficulty in programming the proper divisor.

For example, in the embodiment of FIG. 2, a divisor ratio of 32 is obtained by applying to the presetting inputs D3 to D0 of each of counters 400 and 200 respectively, the bit pattern 1110 0010 prior to counting up. On the 14th, the $C_{OUT}$ output of counter 200 goes high causing the D input of flip-flop 300 to go high. On the 15th count the Q output of flip-flop 300 goes high causing the CE input of counter 400 to go high, overriding the clock, and beginning the count in counter 400. On the 16th clock the count in counter 400 goes to 1111, but the CE input again drops low so that a high is not clocked out of counter 400 into flip-flop 500.

Likewise, on the 30th count the $C_{OUT}$ output of counter 200 again goes high, resulting in the Q output of flip-flop 300 going high on the 31st count. At this point, counter 400 is caused to reach its terminal count so that its $C_{OUT}$ output goes high, causing the D input of flip-flop 500 to go high. Therefore, on the 32nd count, when flip-flop 500 is clocked, the $\overline{Q}$ output of flip-flop 500 goes low enabling the presetting of counters 200 and 400 and the Q output of counter 500 goes high which will repeat every 32 counts.

As is understood by one skilled in the art, the counting apparatus of FIG. 2 can be alternatively described as a series of units composed of a counter and a flip-flop or as a series of counters, each pair of counters being separated by a flip-flop and the last counter being followed by a flip-flop. Taking either approach, it is clear that the string of counters and flip-flops can be extended as far as necessary to achieve the desired divisor ratio and that the present invention is not limited to two counters and two flip-flops.

In order to evaluate the advantage of the synchronous carry frequency divider over frequency dividers employing a terminal count decode network but not a pulse gobbler, propagation delays may be calculated. Using typical propagation delays for the 74 F series logic, including the 74F-161 counter, the 74F-100 NAND gate and the 74F-109 flip-flop, available from Fairchild Semiconductor Division of Fairchild Camera and Instrument Corporation, Mountain View, California, the following results may be obtained. Where $t_{PCQ}$ = the propagation delay on a 1 to 0 transition from clock pulse to counter output, $t_{SPC}$ = the set-up time for a low input counter preset enable before a clock pulse, $t_{PIO}$ = the propagation delay on a 1 to 0 transition from input to output of decoder network (single gate), $t_{PC\overline{Q}}$ = the propagation delay on a 1 to 0 transition from clock pulse to $\overline{Q}$ output of flip-flop, and $T_{MIN}$ = the minimum clock period.

for a frequency divider employing a terminal count decode network $$T_{MIN} = t_{PCQ} + t_{PIO} t_{SPC}. \quad (1)$$

On the other hand, for the synchronous carry frequency divider of the present invention, $$T_{MIN} = t_{PC\overline{Q}} + t_{SPC}. \quad (2)$$

Thus, where $t_{PCQ}$ is 7.5 nanoseconds, $t_{PIO}$ is 3.5 nanoseconds, $t_{SPC}$ is 12 nanoseconds, and $t_{PC\overline{Q}}$ is 5.2 nanoseconds, as for the 74 F series logic, the TMIN for the terminal count decode network is 23 nanoseconds while the $T_{MIN}$ for the synchronous carry frequency divider according to the present invention is calculated to be 17.2 nanoseconds.

Therefore, for this example, the synchronous carry frequency divider is calculated to be capable of a 25% increase in speed over the terminal count decode divider. Also, the synchronous carry divider is lower in complexity and in part count. As a result, the synchronous carry frequency divider allows higher frequency, lower complexity and higher reliability in frequency divider designs than do existing dividers.

While the present invention has been described in terms of a preferred embodiment, further modifications and improvements will occur to those skilled in the art. For example, although input CE is referred to as a count enable or carry input, the term "count enable" is further intended to comprise clock inputs, gating enables, and strobes where appropriate. As another example, although flip-flops are used in the preferred embodiment for elements 300 and 500, it is intended that any clocked memory element including latches, registers and other digital storage elements be comprehended within the scope of the invention as described. In particular, elements 300 and 500 need not be separate flip-flops but may be contained within a shared carry register.

I desire it to be understood, therefore, that this invention is not limited to the particular form shown and I intend in the appended claims to cover all such equivalent variations which come within the scope of the invention as claimed.

I claim:

1. A frequency divider comprising:
   means for applying a clock signal;
   a series of counters, at least all but the initial counter in said series having a count enable input, each counter in said series having a terminal count output for providing a terminal count signal and each counter in said series being coupled to said means for applying;
   means, coupled between the terminal count output of a first counter in each successive pair of counters and the count enable input of a second counter in each successive pair of counters and coupled to said means for applying, for synchronizing application of a terminal count signal to a count enable input with said clock signal.

2. The frequency divider as recited in claim 1 wherein each of said counters comprises a preset enable input and
   further comprising means, coupled to said means for applying, coupled to each of said preset enable inputs, and coupled to the terminal count output of the last counter in said series, for presetting said series of counters.

3. The frequency divider as recited in claim 2 wherein said means for synchronizing comprise a clocked memory element.

4. The frequency divider as recited in claim 2 wherein said means for presetting comprise a clocked memory element.

5. The frequency divider as recited in claim 2 wherein each of said counters is an up counter.

6. The frequency divider as recited in claim 5 wherein said means for presetting comprise a clocked memory element.

7. The frequency divider as recited in claim 2 wherein each of said counters is a down counter.

8. The frequency divider as recited in claim 7 wherein said means for presetting comprise a clocked memory element.

9. The frequency divider as recited in claim 1 wherein said means for synchronizing comprise a clocked memory element.

10. The frequency divider as recited in claim 1 wherein each of said counters is an up counter.

11. The frequency divider as recited in claim 10 wherein said means for synchronizing comprise a clocked memory element.

12. The frequency divider as recited in claim 1 wherein each of said counters is a down counter.

13. The frequency divider as recited in claim 12 wherein said means for synchronizing comprise a clocked memory element.

14. A counting apparatus comprising:
    means for providing a clock signal; and
    a series of counting units coupled to receive the clock signal, each of said counting units comprising an up counter having a terminal count output for providing a terminal count signal and a clocked memory element, coupled to the terminal count output of said counter, for delaying the terminal count signal and synchronizing the delayed signal with said clock signal.

15. A method for using a series of counters to provide a frequency divider, having a high divide modulus, comprising the steps of:
providing a clock signal;
delaying the terminal count of each counter in the series and synchronizing the delayed count with the clock signal;
enabling the clocking of a second counter in each successive pair of counters with the synchronized count of a first counter in the pair; and
applying the synchronized count from a last counter in the series to each counter in the series to preset each counter in the series.

16. A counting apparatus comprising:
means for providing a clock signal; and
a series of counting units coupled to receive the clock signal, each of said counting units comprising a down counter having a terminal count output for providing a terminal count signal and a clocked memory element, coupled to the terminal count output of said counter for delaying the terminal count signal and synchronizing the delayed signal with said clock signal.

* * * * *